US010539621B2

United States Patent
Chow et al.

(10) Patent No.: US 10,539,621 B2
(45) Date of Patent: Jan. 21, 2020

(54) METHOD AND APPARATUS FOR IDENTIFYING A BATTERY MODEL

(71) Applicants: TOTAL SOLAR INTERNATIONAL, Courbevoie (FR); NORTH CAROLINA STATE UNIVERSITY, Raleigh, NC (US)

(72) Inventors: Mo-Yuen Chow, Cary, NC (US); Bharat Balagopal, Raleigh, NC (US); Wente Zeng, Cary, NC (US)

(73) Assignees: TOTAL SOLAR INTERNATIONAL, Courbevoie (FR); NORTH CAROLINA STATE UNIVERSITY, Raleigh, NC (US)

( * ) Notice: Subject to any disclaimer, the term of this patent is extended or adjusted under 35 U.S.C. 154(b) by 244 days.

(21) Appl. No.: 15/667,103

(22) Filed: Aug. 2, 2017

(65) Prior Publication Data

US 2019/0041464 A1   Feb. 7, 2019

(51) Int. Cl.
*G06F 11/30* (2006.01)
*G01R 31/36* (2019.01)
*G01R 31/392* (2019.01)

(52) U.S. Cl.
CPC ..... *G01R 31/3648* (2013.01); *G01R 31/3646* (2019.01); *G01R 31/392* (2019.01)

(58) Field of Classification Search
CPC .................................................. G01R 31/3648
See application file for complete search history.

(56) References Cited

U.S. PATENT DOCUMENTS

2014/0350877 A1*  11/2014  Chow ................. G06F 17/5036
                                                  702/63
2016/0209472 A1*  7/2016  Chow ..................... B60L 58/12

OTHER PUBLICATIONS

Bharat Balagopal, et al., "Effect of Anode Conductivity Degradation on the Thevenin Circuit Model of Lithium Ion Batteries", $42^{nd}$ Annual Conference of the IEEE Industrial Electronics Society, IECON, Oct. 2016, 6 pages.
Bharat Balagopal, et al., "First Principle Based Degradation Modeling to Improve State of Health (SOH) Estimation Accuracy for Lithium Ion Batteries", Freedom Systems Center, Dec. 2016, 1 page.

(Continued)

*Primary Examiner* — Phuong Huynh
(74) *Attorney, Agent, or Firm* — Oblon, McClelland, Maier & Neustadt, L.L.P.

(57) ABSTRACT

A method, an apparatus, and a system for determining a state of a battery are provided. The method includes acquiring battery information from a sensor associated with the battery. The battery information includes at least terminal voltage and a terminal current. The method further includes estimating degradation information based on a first principle degradation model and the battery information. The first principle degradation model is a three dimensional model that includes a plurality of layers having one or more attributes representative of physical parameters of the battery. The method further includes identifying a circuit model based on the degradation information and the battery information, determining the state of the battery using the identified circuit model, and implementing a control action or a notification based on the determined state of the battery.

20 Claims, 11 Drawing Sheets

(56) References Cited

OTHER PUBLICATIONS

Bharat Balagopal, et al., "The State of the Art Approaches to Estimate the State of Health (SOH) and State of Function (SOF) of Lithium Ion Batteries", $13^{th}$ IEEE Industrial Conference on Industrial Informatics (INDIN), 2015, pp. 1302-1307.

* cited by examiner

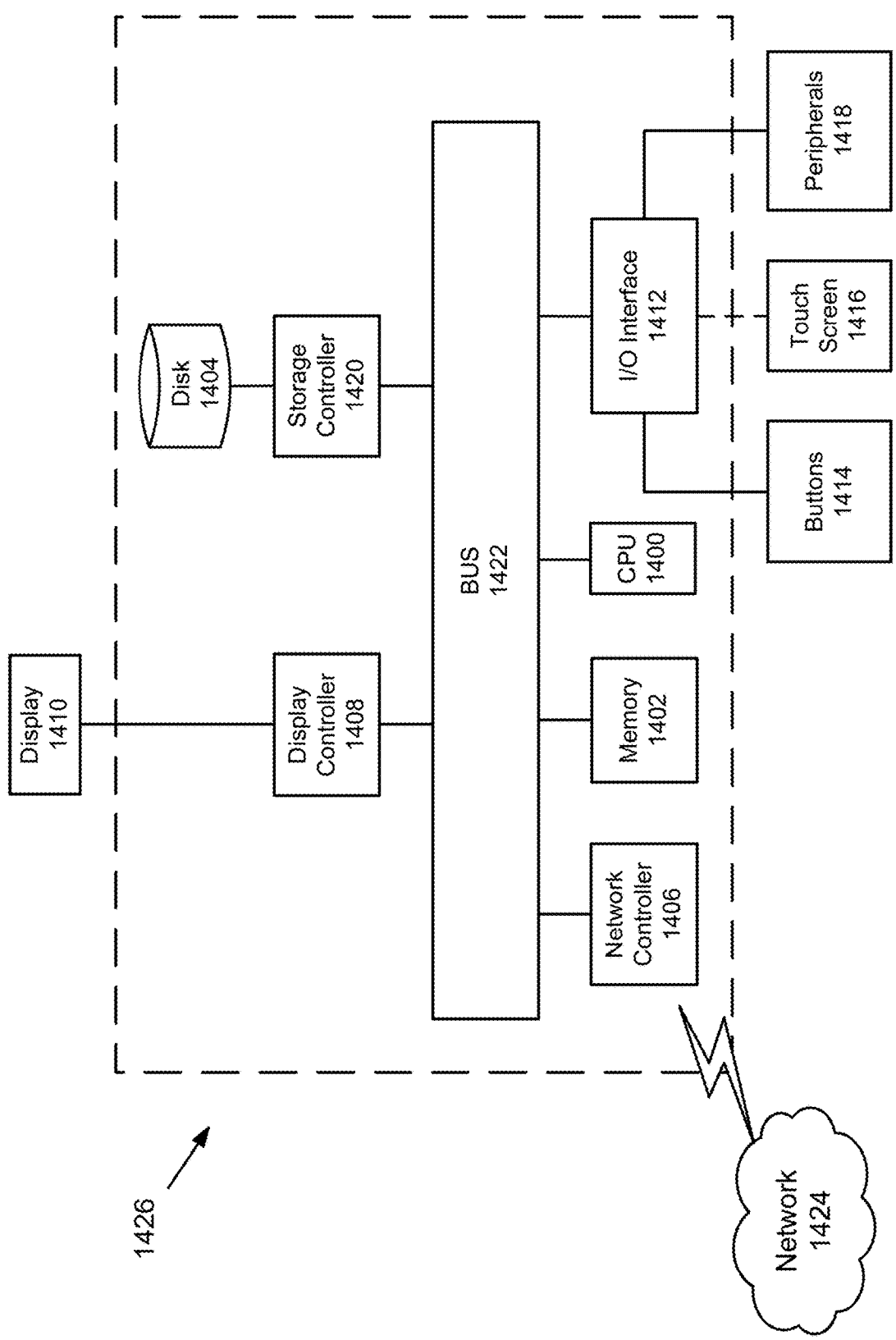

METHOD AND APPARATUS FOR IDENTIFYING A BATTERY MODEL

STATEMENT REGARDING FEDERALLY SPONSORED RESEARCH

This invention was made with government support under grant number IIP-1500208 awarded by the National Science Foundation. The government has certain rights in the invention.

BACKGROUND

Batteries play an important role in the portable energy market as well in the smart grid. This has motivated researchers to not only develop new chemistries for batteries but to also work on developing algorithms to predict the state of health (SOH) and state of function (SOF) of the battery. The SOH of the battery has been represented in terms of capacity degradation or internal resistance increase. The SOF of the battery on the other hand, is estimated based on the usability of the battery for a particular application as described in B. Balagopal and M. Y. Chow, "The State of the Art Approaches to Estimate the State of Health (SOH) and State of Function (SOF) of Lithium Ion Batteries," in 13*th IEEE Industrial Conference on Industrial Informatics (IN-DIN)*, Cambridge, UK, 2015. However, the representation of SOH and SOF are based on the association of the battery to its Thevenin circuit model (TCM). While capacity and internal resistance are good indicators of the health of the battery, they may not be the only ones. Accordingly, what is needed, as recognized by the present inventors, is a method and a system capable of modeling a battery degradation process.

The foregoing "Background" description is for the purpose of generally presenting the context of the disclosure. Work of the inventors, to the extent it is described in this background section, as well as aspects of the description which may not otherwise qualify as prior art at the time of filing, are neither expressly or impliedly admitted as prior art against the present invention.

SUMMARY

The present disclosure relates to a method for determining a state of a battery. The method includes acquiring battery information from at least a sensor associated with the battery. The battery information includes at least a terminal voltage and a terminal current. The method further includes estimating degradation information based on a first principle degradation model and the battery information. The first principle degradation model is a three dimensional model that includes a plurality of layers having one or more attributes representative of physical parameters of the battery. The method further includes identifying a circuit model based on the degradation information and the battery information, determining the state of the battery using the identified circuit model, and implementing a control action or a notification based on the determined state of the battery.

The present disclosure also relates to a system. The system includes a battery, at least one sensor, and circuitry. The at least one sensor is configured to detect at least a terminal voltage and a terminal current. The circuitry is configured to acquire battery information from the at least one sensor and estimate degradation information based on a first principle degradation model and the battery information. The first principle degradation model is a three dimensional model and includes a plurality of layers having one or more attributes representative of physical parameters of the battery. The circuitry is further configured to identify a circuit model representative of the battery based on the degradation information and the batter information, determine a state of the battery using the identified circuit model, and implement a control action or a notification based on the determined state of the battery.

The present disclosure also relates to an apparatus for determining a state of a battery. The apparatus includes at least one sensor and processing circuitry. The at least one sensor is configured to acquire battery information from a battery. The battery information includes at least a terminal voltage and a terminal current. The processing circuitry configured to estimate degradation information based on a first principle degradation model and the battery information, the first principle degradation model being a three dimensional model and including a plurality of layers having one or more attributes representative of physical parameters of the battery, identify a circuit model representative of the battery based on the degradation information and the battery information, determine a state of the battery using the identified circuit model, and implement a control action or a notification based on the determined state of the battery.

The foregoing paragraphs have been provided by way of general introduction, and are not intended to limit the scope of the following claims. The described embodiments, together with further advantages, will be best understood by reference to the following detailed description taken in conjunction with the accompanying drawings.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein:

FIG. 14 is an exemplary block diagram of a computer according to one example.

DETAILED DESCRIPTION

Figure 1:
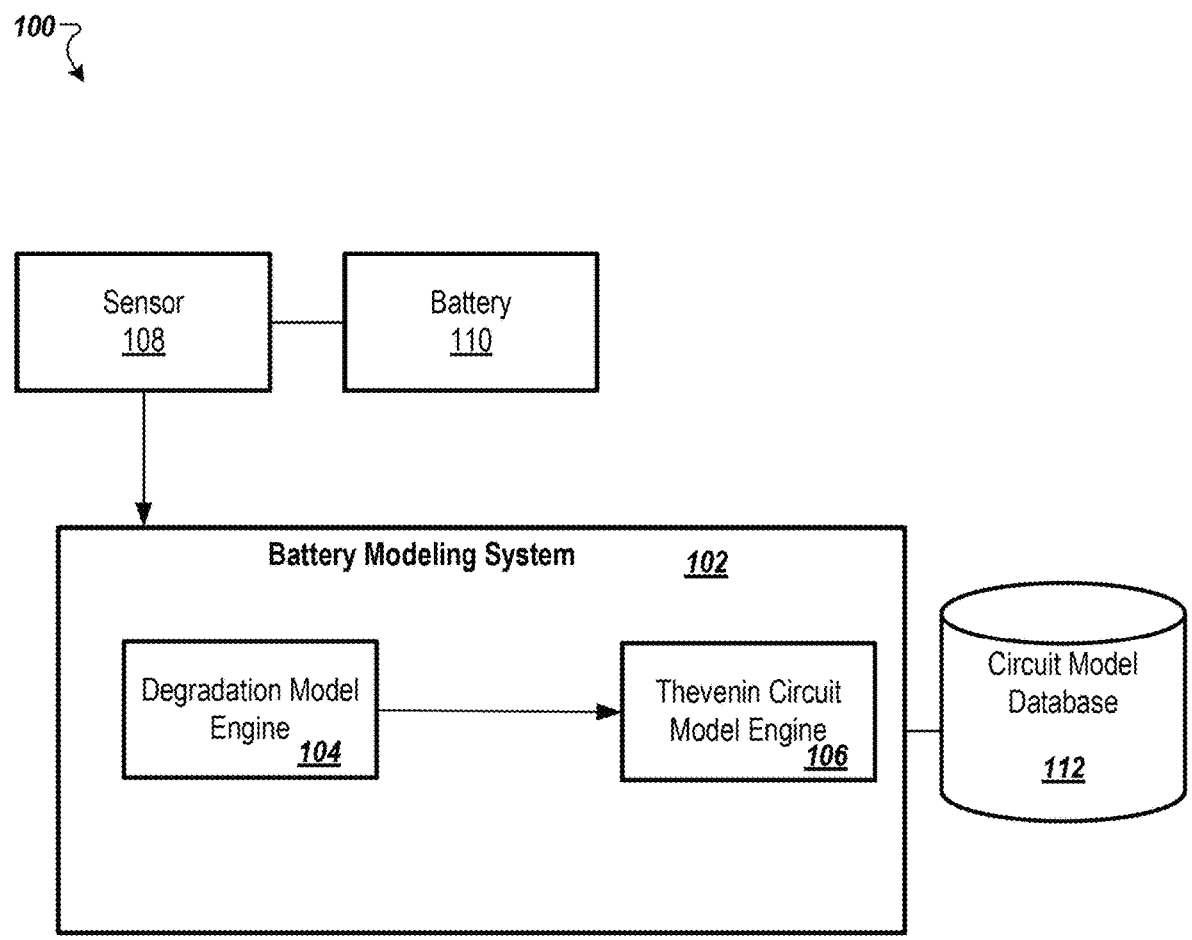
FIG. 1 is an exemplary diagram of an example environment for a battery management system according to one example.

Referring now to the drawings, wherein like reference numerals designate identical or corresponding parts throughout several views, the following description relates to an apparatus and associated methodology for identifying a battery model. The battery model may be used to estimate a state of a battery such as a state of health (SOH), a state of function (SOF), and a state of charge (SOC).

The terms "a" or "an", as used herein, are defined as one or more than one. The term "plurality", as used herein, is defined as two or more than two. The term "another", as used herein, is defined as at least a second or more. The terms "including" and/or "having", as used herein, are defined as comprising (i.e., open language). The term "coupled", as used herein, is defined as connected, although not necessarily directly, and not necessarily mechanically.

Thevenin circuit models (TCMs) are often used to estimate the SOC and the SOH of a battery. Although the TCM is fast in computing the SOC, SOH, and other attributes, the TCM compromises on the accuracy and uniqueness of representation of the battery. For example, the capacitances are used to model the capacity of the battery as well as the relaxation effect during charging/discharging. The resistors on the other hand are used to model the effect of overpotentials due to different degradation phenomena (e.g., solid-electrolyte interphase (SEI) growth, anode degradation, contact loss, loss of lithium ions). However, if a constant current is being drawn from the battery, then there is no capacitance effect and the TCM is purely resistive. The apparatus and associated methodologies described herein identify an accurate model to represent the battery based on degradation information determined using a first principle based degradation model.

FIG. 1 is an exemplary diagram of an example environment 100 for a battery modelling system 102. The battery modelling system 102 may include a degradation model engine 104 and a circuit model engine 106. The battery management system 102 may also include a circuit model database 112.

The degradation model engine 104 identifies the degradation information of the battery based on battery information and outputs the degradation information to the circuit model engine 106. The degradation model engine 104 may use a three dimensional first principle based degradation model (3DM). The model is described further below. The circuit model engine 106 may model a battery 110 (e.g., a lithium-ion battery) based on a Thevenin circuit model. The circuit model engine 106 may select the TCM that has parameter values and/or topology that accurately represents the battery's behavior at a particular level of degradation based on the degradation information received from the degradation model engine 104. Thus, the circuit model engine 106 may predict the SOH and the SOF accurately. The SOC, SOH, and SOH may be output via an output device (e.g., display) associated with the battery 110. Further, the degradation model engine 104 may model and generate a graphical representation of a current distribution inside the battery 110 for different operating conditions.

The degradation model engine 104 and the circuit model engine 106 may be implemented as either software and/or hardware modules and may be stored in any type of computer-readable medium or other computer storage device. For example, each of the engines described herein may be implemented in circuitry that is programmable (e.g., microprocessor-based circuits) or dedicated circuits such as application specific integrated circuits (ASICS) or field programmable gate arrays (FPGAS). In some implementations, the processes associated with each of the engines may be performed by one or more processors of a server, a computer, or other computing resources, which can include cloud computing resources. For example, the processes may be performed by a computer 1426 shown in FIG. 14. The computer 1426 may include a CPU 1400 and a memory 1402 as shown in FIG. 14. In one implementation, the circuit model database 112 may be implemented in the memory 1402 of the computer 1426.

The battery modeling system 102 may receive information regarding the battery 110 from a sensor 108. The battery information may include, for example, a voltage of a battery, a current, such as the current to and from the battery 110, a battery temperature. The sensor 108 may include a voltmeter, an ammeter, or other electric circuit components, but the types of sensor 108 are not limited thereto.

The circuit model database 112 may store equivalent models of the battery 110. For example, the circuit model database 112 may store the number of RC pairs (e.g., one RC) used in the equivalent model. Further, the circuit model database 112 may store an association between the degradation information and various parameters and topologies of circuit models (e.g., in a look-up table).

The sensor 108 and the battery modeling system 102 may be included in apparatus for determining the state of the battery. The apparatus may be connected to the battery to determine the state of the battery. Further, the apparatus may output a control signal to control the battery based on the determined state.

In one implementation, the battery 110 may be a part of a home energy management system. The battery 110 may be recharged from a grid or renewable energy sources (e.g., solar photovoltaics, wind power generation systems, hydraulic energy sources, etc.). The battery 110 may be used to supply power when the cost of electricity is high and be recharged when the cost is low. The cost may include factors such as the price of the electricity the grid (utility), battery wear cost, and the like. A precise estimation of the SOC and SOH of the battery 110 in turn provides for an optimal operation of the battery 110. The battery modeling system 102 may identify the state of battery accurately online and in real-time.

In one implementation, the battery 110 may be a part of a building energy management system at a commercial building, a residential building, or an industrial building.

In one implementation, the method described herein may be used in a power microgrid system that includes renewable energy sources and at least the battery 110. Further, the microgrid system may be a hybrid microgrid that includes renewable energy sources, the battery 110, and a second energy source such as a diesel/gas generator.

In one implementation, the method described herein may be applied in aggregated distributed energy resources systems that include electric battery storage in a commercial building, an industrial building, or a residential building or a home.

In one implementation, the battery 110 may be a part of any device that is powered by a battery. For example, the device may be an electronic device such as a laptop, smartphone, cellphone, tablet, watch, health bracelet, and the like. The battery 110 may be a part of a portable power tool (e.g., drills, saws, sanders and heat guns).

In one implementation, the battery 110 may be a part of an aerospace structure such as a satellite, an aircraft, a spacecraft, and other space vehicles.

In one implementation, the battery 110 may include a battery in an electric vehicle (EV). In another example, the battery may be a large-capacity battery bank used in a data center or a smart grid.

Figure 2:
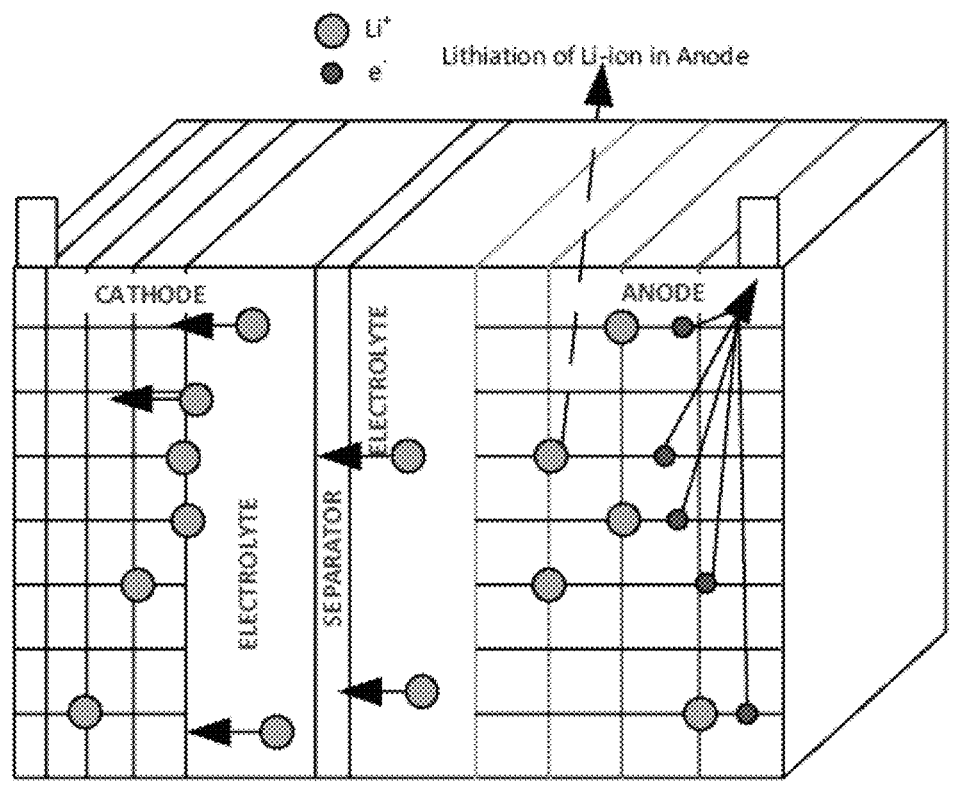
FIG. 2 is a schematic that shows a movement of ions and electrons during battery discharge according to one example.

The battery 110 may include several components namely, an anode, a cathode, an electrolyte, a separator and current collectors. During discharging, the anode of the battery undergoes oxidation resulting in the loss of electrons. The electrons flow through the external/load circuit while the lithium ions flow from the anode to the cathode through the electrolyte. The cathode undergoes reduction by accepting electrons and the lithium ion and thereby completing the circuit. Schematic 200 in FIG. 2 shows a movement of ions and electrons during battery discharge. The process may be illustrated using the equations below:

At the cathode: (Gain of Electrons–Reduction)

$$Li_{1-x}CoO_2 + xLi^+ + xe^- \rightleftharpoons LiCoO_2 \qquad (1)$$

At the anode: (Loss of Electrons–Oxidation)

$$C_nLi_x \rightleftharpoons C_n + xLi^+ + xe^- \qquad (2)$$

During charging, the electrons flow in the opposite direction resulting in an oxidation reaction at the cathode and reduction reaction at the anode.

The degradation of any or all of the components of the battery 110 affects the battery's performance. For example, the anode of the battery 110 can undergo degradation in the form of disintegration because of wear and tear. This may result in a drop in the conductivity of the anode and in the reduction of ions that can hold and release electrons. The electrolyte of the battery 110 can undergo degradation when it is exposed to harsh temperatures or operating currents resulting in it either coagulating or disintegrating. With the loss of electrolyte, the medium for transfer of ions is lost and there is an increased resistance to the flow of ions.

The anode of the battery 110 may undergo significant degradation in comparison with other battery components. The effect of the decrease in the anode conductivity and its impact on the parameters of the TCM of the battery 110 is described next.

Graphite electrodes are commonly used as anodes in most lithium ion batteries. However, graphite electrodes are highly susceptible to degradation. When the anode degrades, it loses its ability to accept ions and generate electrons to produce current. This kind of degradation happens at the early stages of the battery's life if it exposed to high temperatures or high charging and discharging currents. When exposed to high charging or discharging currents, the anode experiences deposition instead of lithiation because the anode does not have enough time to allow the lithium ions to intercalate into the right position. The deposition results in the disintegration of the anode and formation of unreactive chemical compounds. The unreactive chemical compounds increase the resistance to the flow of ions and electrons and is reflected in the decrease in the conductivity of the anode. In order to determine the effects of anode degradation, battery models may be used.

Current physics-based models of the battery include one-dimensional (1D), pseudo two-dimensional (2D), or pseudo three-dimensional (3D) models. The design, operation, advantages and disadvantages of these models are described next.

Figure 3:
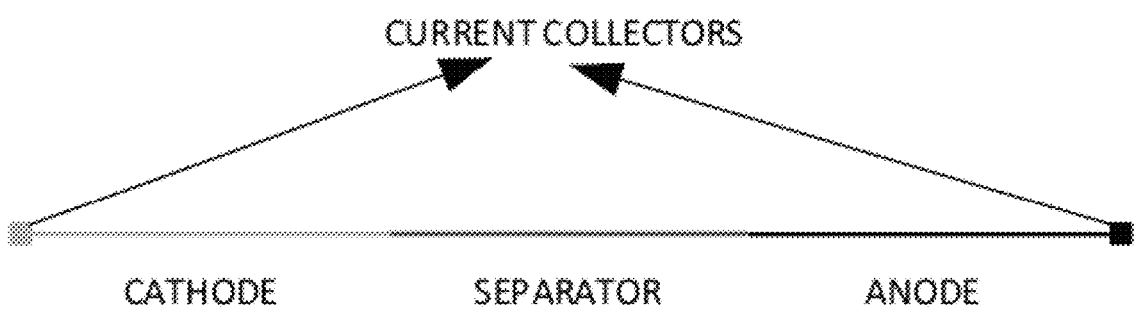
FIG. 3 is a schematic that shows a one-dimensional (1D) model of a battery according to one example.

In the 1D model, the battery is modeled as a line. The anode, the cathode, and the separator are modeled as line segments as shown in FIG. 3. The current collectors are modeled as points on either end of the line. During charging or discharging, lithium ion flows to the anode or cathode respectively through the separator. The separator is assumed to be ideal. The model approximates partial differential equations that represent the behavior of the battery to linear equations and solves for the change in the concentration of the lithium ions during charging or discharging. Using the change in the concentration of lithium ions, the change in the potential is calculated at either terminal of the battery. The 1D model requires little computation and can produce results in the order of one tenth of a second. However, the 1D model cannot simulate the degradation of the different parameters of the battery. For example, the degradation of the anode results in a difference in the distribution of current (i.e., the current density). These effects cannot be observed using the 1D model of the battery.

Figure 4:
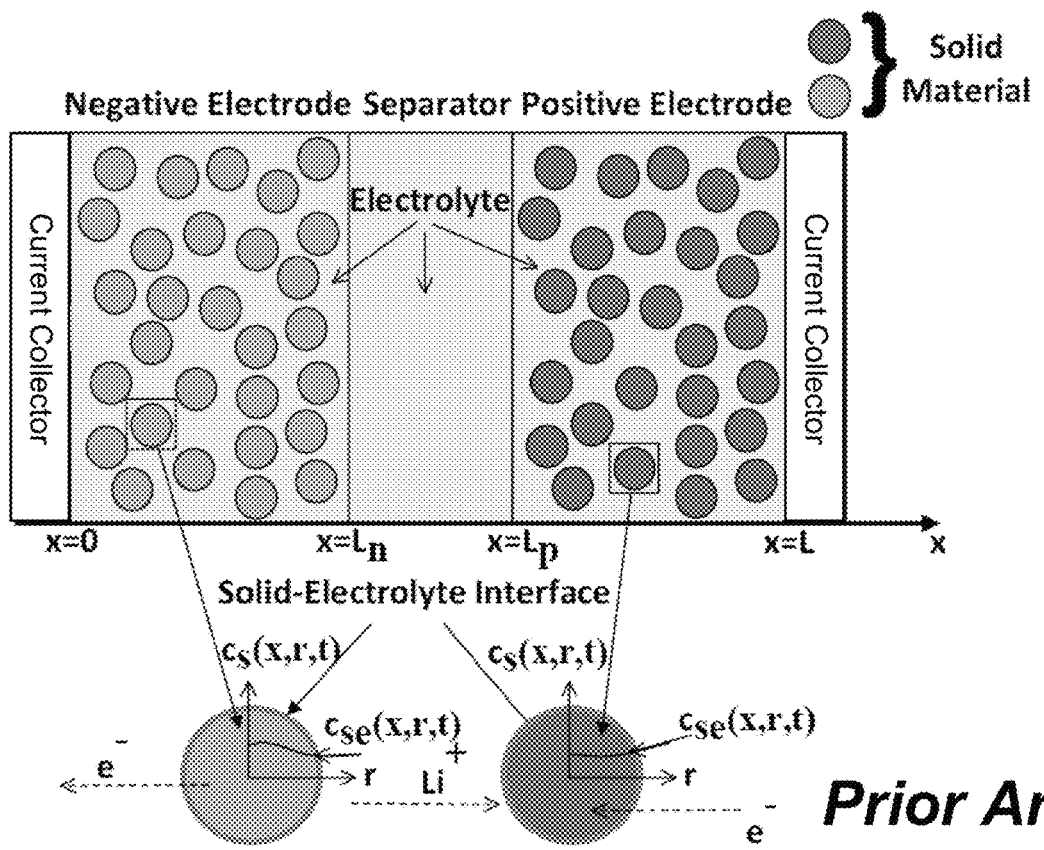
FIG. 4 is a schematic that shows a pseudo two-dimensional (P2D) model of the battery according to one example.

The pseudo 2D model represents the battery's electrodes as circles and uses the 1D cross section of the battery to simulate the flow ions during the charging or the discharging of the battery. The pseudo 2D model is shown in FIG. 4. The model is called pseudo because the second dimension is along the radius of the electrode and not truly a second dimension. The pseudo 2D model works similar to the 1D model but also includes the effect of diffusion in the electrolyte and solid (electrode) phases as well as the Butler Volmer kinetics for modeling the electrode kinetics. The pseudo 2D model is developed using partial differential equations that relate the concentration of lithium ions and the potential in the electrode and electrolyte with the current flow as time varies along the radius of the particle and the length of the cell. The pseudo 2D model can estimate the electrolyte concentration, electrolyte potential, electrode potential and electrode concentration in the electrode, and the electrolyte potential and concentration in the separator. However, the pseudo 2D model cannot model the distribution of the current density on the surface of the electrode.

The pseudo 3D model is similar to the pseudo 2D model. The pseudo 3D model models the current flow between the electrodes like the 1D model and uses the current information to identify the temperature distribution along the surface of the electrodes.

Figure 5:
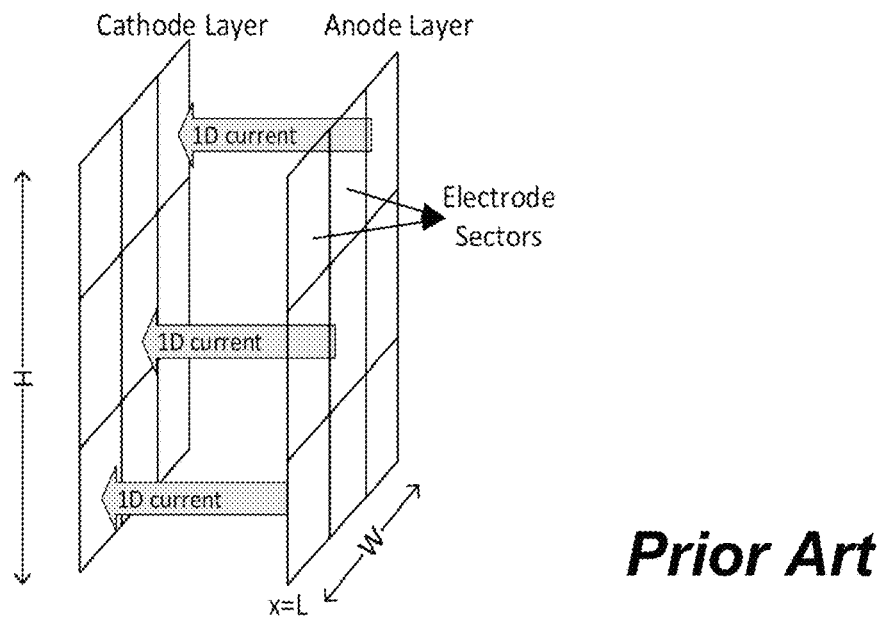
FIG. 5 is a schematic that shows a pseudo three-dimensional (3PD) model of the battery according to one example.

FIG. 5 is a schematic that shows the pseudo 3D model of the battery according to one example. The pseudo 3D model can simulate the growth of SET and can model the temperature distribution along the surface of the electrode. However, the pseudo 3D model does not address the current distribution in the electrolyte and on the surface of the electrode respectively.

The 3D first principle based degradation model (3DM) described herein provides the ability to simulate different levels of degradation of the battery 110. To provide higher resolution, the 3D model described herein represents the battery 110 in terms of layers and the electrode as porous electrode layers. By using layers, the degradation model engine 104 can determine the degradation of different layers of the battery 110 and can determine the performance of the battery 110 based on the degradation information. The remaining useful life and time to failure of the battery 110 may be predicted using the high resolution modeling of the battery's degradation. The battery 110 may modeled in 3D model plane. The 3DM is time dependent.

Figure 6:
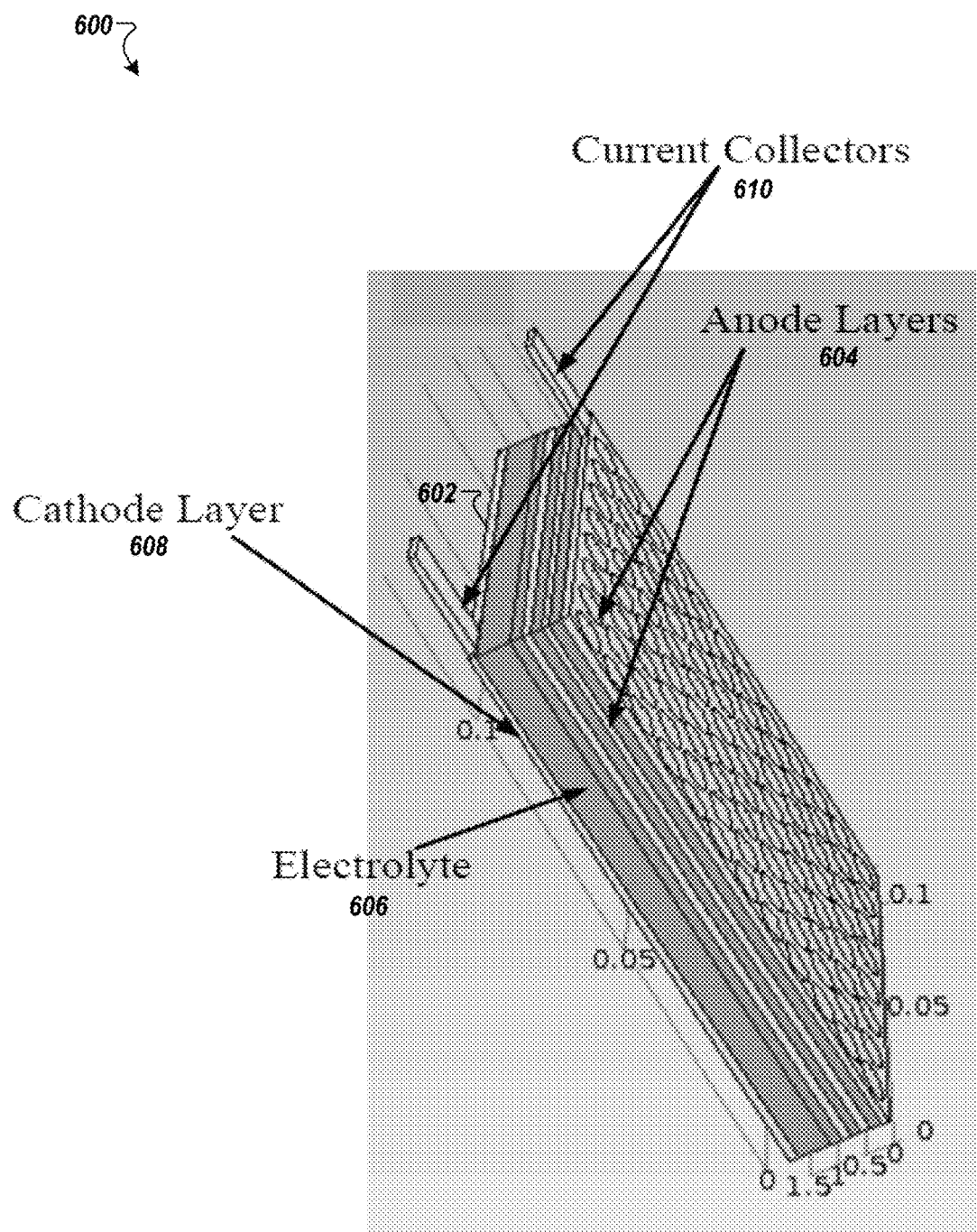
FIG. 6 is a schematic that shows a three-dimensional degradation model (3DM) of the battery according to one example.

FIG. 6 is a schematic 600 that shows the 3DM of the battery 110 according to one example. In one implementation, a prismatic cell 602 is considered (i.e., rectangular in shape). The anode may be modeled as one or more anode layers 604 including circular porous electrodes and is surrounded by electrolyte 606. Each anode layer 604 is extruded to the thickness of the electrodes. Multiple layers of the anode are modeled because often, the anode is fabricated to be thicker than the cathode. This is done to ensure that even when the anode undergoes degradation, there is sufficient material left to meet the battery warranty requirements. The layer of electrolyte 606 is used to "separate" a cathode layer 608 from the anode layers 604. Since the separator used in the battery 110 is to only electrically isolate the anode and the cathode and not hinder the reaction, the separator may not be modeled in the 3DM described herein. The 3DM also includes current collectors 610.

In one implementation, COMSOL® is used as a tool to implement the inventive 3DM. The anode is selected to be graphite, the cathode to be lithium iron phosphate, and the electrolyte to be lithium phosphorus hexafluoride in a 1:2 ethylene dicarbonate dimethyl carbonate organic polymer solvent (LiPF6 in 1:2 EC:DMC and p(VdF-HFP)). A first porous electrode is assigned to a first domain associated with the anode and a second porous electrode to a second domain associated with the cathode. In the first porous electrode domain for the anode, the electrolyte properties are set to LiPF6 and the electrode properties are set to graphite. Similarly, the cathode's properties are defined using the material that is associated with it. The cathode's conductivity is defined based on the material unlike the definition for the anode.

The conductivity of the anode is varied so that the anode degradation effects can be modelled. The initial state of charge of the battery is set to 100% or 1 and the capacity of the battery is set to 2.1 ampere-hour (Ah). The advantage of using this initial cell charge distribution is that, it can either be used to control the operation of the battery based on the state of charge or the terminal voltage. In order to be able to measure the voltage across the terminals, a reference to the cathode is assigned and the measurement of the voltage is taken at the anode. Therefore, it is possible to measure the change in the potential across terminals as the battery discharges. Exemplary battery design parameters are shown in Table 1.

In order to simulate discharging, an electrode current is included in the model. A time dependent current distribution initialization is added to model discharging. The time dependent part of the simulation tests the model at different time steps while the current distribution initialization determines the effects that result in the generation of the overpotential of the battery. The primary current distribution only considers the loss due to electrolyte resistance i.e., as a linear function following Ohm's law).

Figure 7:
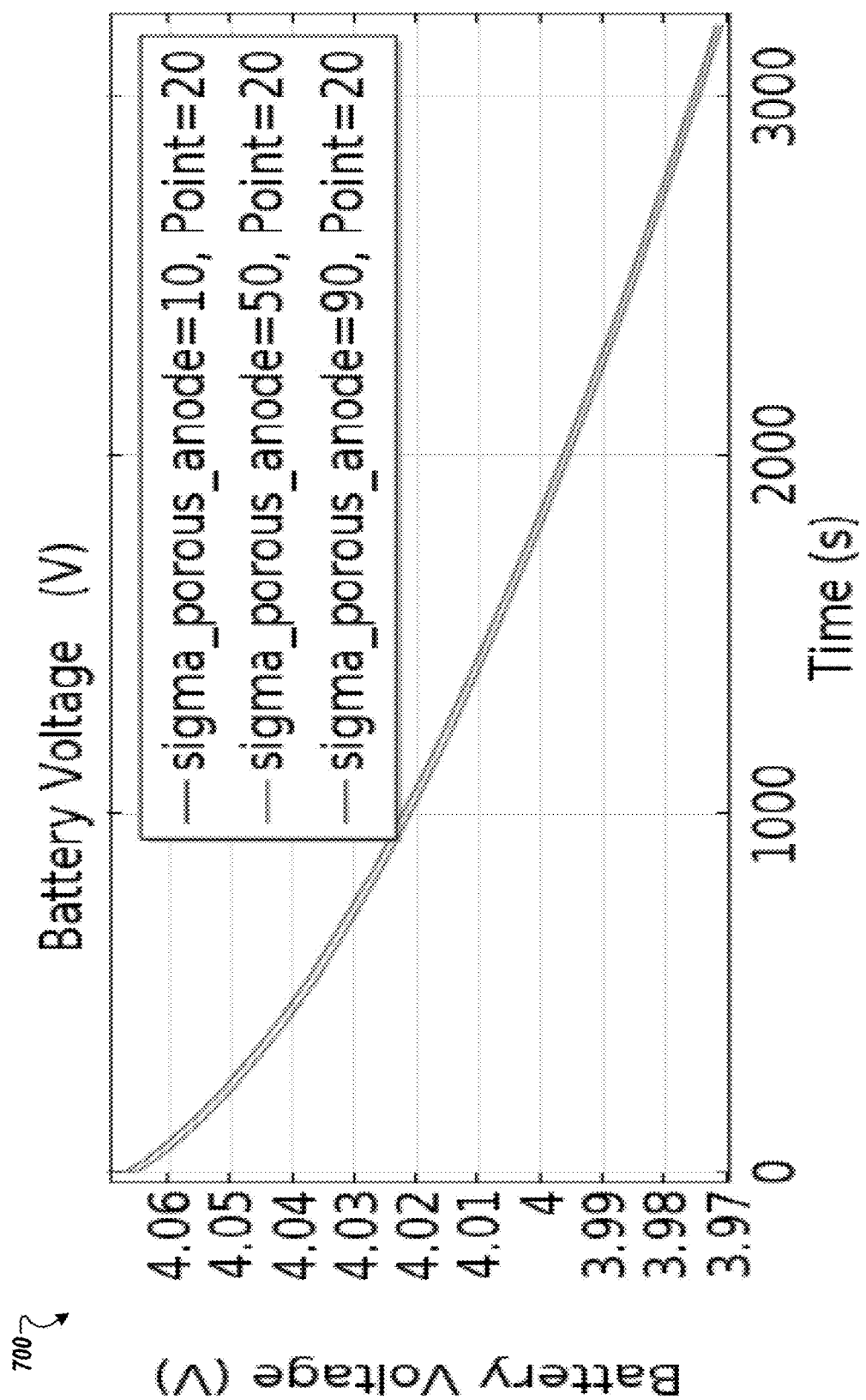
FIG. 7 is a schematic that shows a terminal voltage for a discharging current according to one example.

To study the effects of conductivity degradation of the anode, the conductivity of the anode is considered as a sweep parameter. Schematic 700 in FIG. 7 shows the terminal voltage of the battery observed under three different anode conductivity degradation levels. It is observed that as the anode's conductivity degrades, there is a faster drop in the terminal voltage of the battery. This phenomenon is also confirmed using the mathematical derivation described later herein. A faster drop in the terminal voltage of the battery is also observed when the battery's capacity begins to decrease.

TABLE 1

| Battery design parameters | |
|---|---|
| Length | 0.145 m |
| Height | 0.111 m |
| Electrode width | 0.00145 m |
| Electrolyte width | 0.002 m |
| Anode conductivity | 90 S/m |
| Cathode conductivity | 100 S/m |
| Battery capacity | 2.1 Ah |
| Temperature | 298K |

There are a number of partial differential equations (PDEs) that are used to represent the behavior of the battery in 1D. When these PDEs are expanded to 3D, they are highly interdependent.

The conservation of charge in the solid phase along the x direction may be expressed as:

$$\frac{\partial}{\partial x}\left(\sigma^{\text{eff}} \frac{\partial \phi_s}{\partial x}\right) = j^{Li} \quad (3)$$

where $j^{Li}$ is the current density on the electrode surface, $\sigma^{\text{eff}}$ is the effective conductivity of the solid electrode, $\phi_s$ is the surface potential of the electrode.

Therefore, for a constant current, $j^{Li}$, the change in the surface potential be determined by the first principle model engine 104 using:

$$\phi_s = \int\int \frac{j^{Li}}{\sigma^{\text{eff}}} \partial x \partial x. \quad (4)$$

Using equation (4), the terminal voltage of battery may be expressed as $$V_t = \frac{\phi_{sc} - \phi_{sa}}{V_{dc}} - \eta \quad (5)$$

where $V_t$ is the terminal voltage of the battery in Volt (V), $\phi_{sa}$ is the electric potential of the anode (V), $\phi_{sc}$ is the electric potential of the cathode (V), and $\eta$ is the overpotential of the battery (V).

When $\phi_{sa}$ increases at a faster rate, then $V_t$ begins to decrease faster. This is established based on the assumption that $\sigma_{\text{eff}}$ of the cathode does not change. Therefore, the rate of change of $\phi_{sc}$ may not change. However, when the $\sigma_{\text{eff}}$ of the anode changes, the $\phi_{sa}$ may change faster to maintain the conservation of charge. Let this increased rate of change in the potential of the negative electrode be represented as $\Delta\phi_{sa}$.

Figure 8:
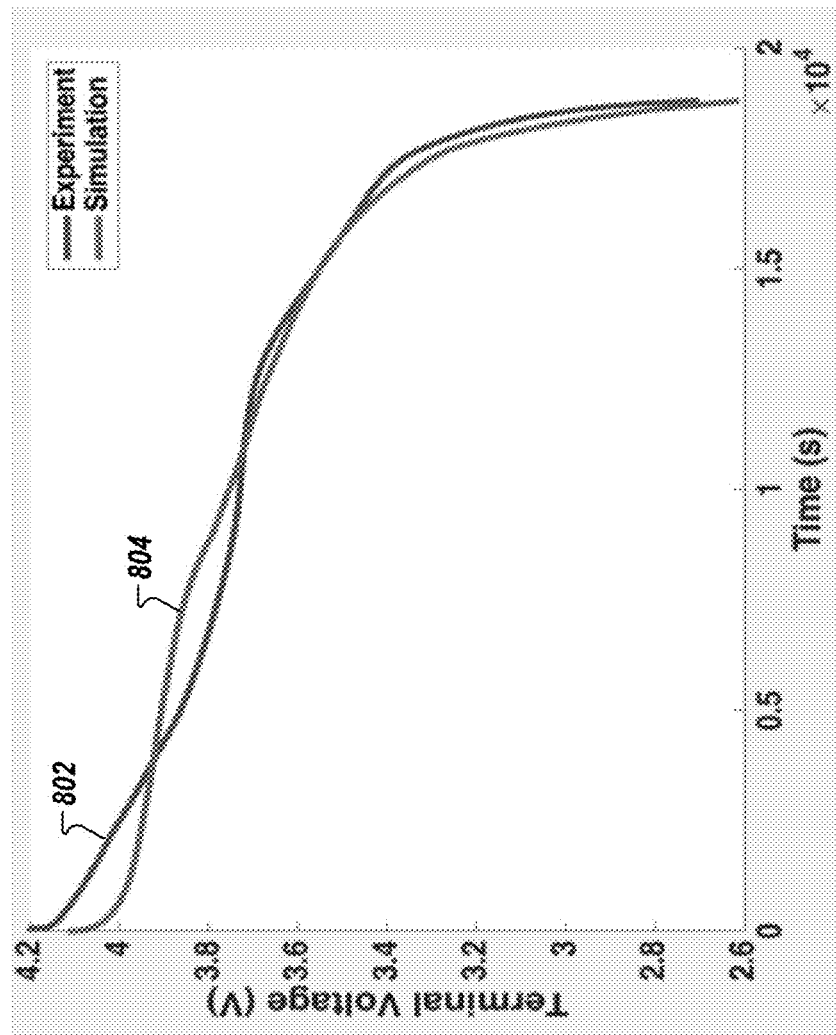
FIG. 8 is a schematic that shows a plot of the terminal voltage versus time for constant current discharge according to one example.

The validity of the first principle model described herein is tested using experimental data obtained from discharging the battery 110. The battery tested is rated at 2.1 Ah and is discharged at a C-rate of 1C. The model is simulated with a capacity of 2.1 Ah and tested under a load current of 1C. The load current (i.e., discharge current in a discharging cycle) represents a current flowing from the battery to a load (e.g., resistor). The results are shown in schematic 800 of FIG. 8. Schematic 800 depicts the terminal voltage of the battery versus time. Trace 802 shows the experimental data and trace 804 shows the simulation data. The data from the simulation closely agrees the experimental data. The errors in the terminal voltage of the simulated data are due to assumptions made in the primary current distribution technique. In one implementation, the electrode kinetics and electrode-electrolyte interface effects are implemented in the model. Including electrode kinetics and electrode-electrolyte interface dynamics provide more accuracy as well as scope for simulating more degradation effects in the battery model.

Figure 9:
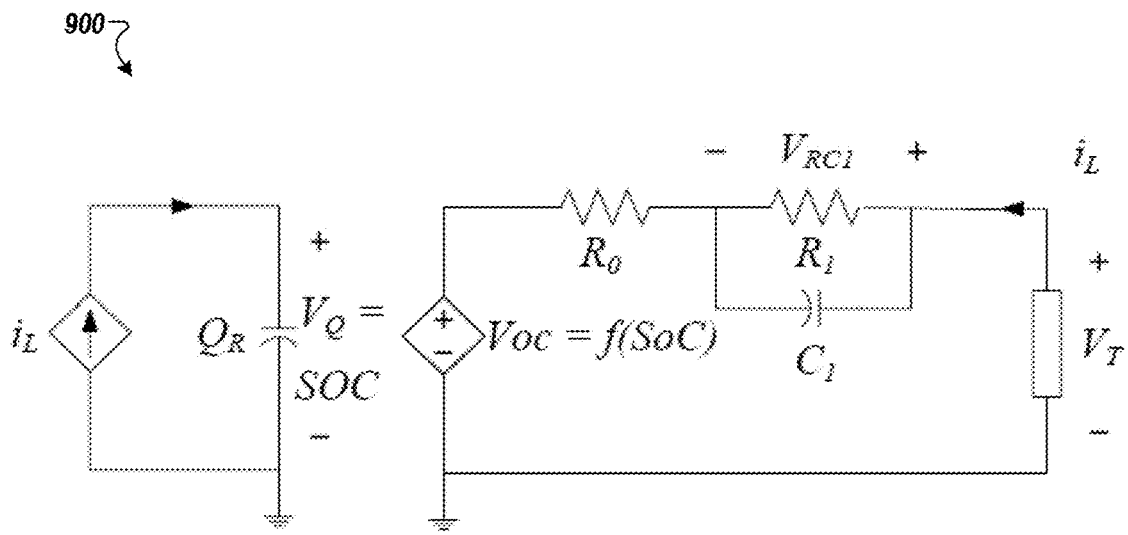
FIG. 9 is a schematic that shows a Thevenin circuit model (TCM) according to one example.

FIG. 9 is a schematic that shows a Thevenin circuit model 900. The TCM 900 may include one RC pair. The terminal voltage of the battery can be written as:

$$V_t = V_{OC} + V_{RC} + R_0 I_L \quad (6)$$

Using (5) and (6), $V_{OC}$ can be expressed as:

$$V_{OC} - \eta - \Delta\phi_{sa} = V_{OC} - \tilde{V}_{RC} - \tilde{R}_0 I_L \quad (7)$$

In an ideal condition, where no degradation happens $V_{OC}$ may be expressed as:

$$V_{OC} - \eta = V_{OC} - V_{RC} - R_0 I_L \quad (8)$$

Subtracting equations (7) and (8), $\Delta\phi_{sa}$ may be expressed as:

$$\Delta\phi_{sa} = (\tilde{V}_{RC} - V_{RC}) + (\tilde{R}_0 - R_0) I_L \quad (9)$$

Depending on charging or discharging, $\Delta\phi_{sa}$ can either be positive or negative. Since $I_L$ is constant and $R_0$ is a reference internal resistance, the value of $\tilde{R}_0$ increases so as to result in a faster drop in the terminal voltage of the battery during discharge.

As the battery ages, the terminal voltage of the battery begins to drop rapidly. While capacitors store energy using an electric field, batteries store energy using, chemical reactions. However, the similarity is that they both store and release charge.

The capacitance of a capacitor is given by the formula:

$$C = \frac{A\varepsilon\varepsilon_0}{d} \quad (10)$$

where C is the capacitance of the capacitor in farad (F), A is the area between the plates of the capacitor in square meter ($m^2$), $\varepsilon$ is the relative permittivity of the dielectric material, $\varepsilon_0$ is the permittivity of air in Farad per meter (F/m), and d is the distance between the plates of the capacitor in meter (m).

Assuming a constant voltage is used to charge a capacitor, and A, d, $\varepsilon_0$ are constants, the only parameter that can vary in equation (10) is the permittivity. The permittivity of the capacitor determines the amount of charge the capacitor can store. When the permittivity of the capacitor decreases then the ability of the capacitor to store charge decreases.

Using the formula for the resistance of a material, the relationship between the resistivity and the permittivity may be expressed as:

$$\rho \propto \frac{1}{\varepsilon} \quad (11)$$

where $\rho$ is the resistivity of the material in ohm meter ($\Omega m$) and $\varepsilon$ is the relative permittivity of the dielectric material.

Equation (11) indicates that for a decrease in the permittivity of the capacitor, there is an increase in the resistivity when there is a changing current. For a constant current draw, only a faster drop in the terminal voltage is observed because of the increased IR drop across the internal resistance.

Figure 10:
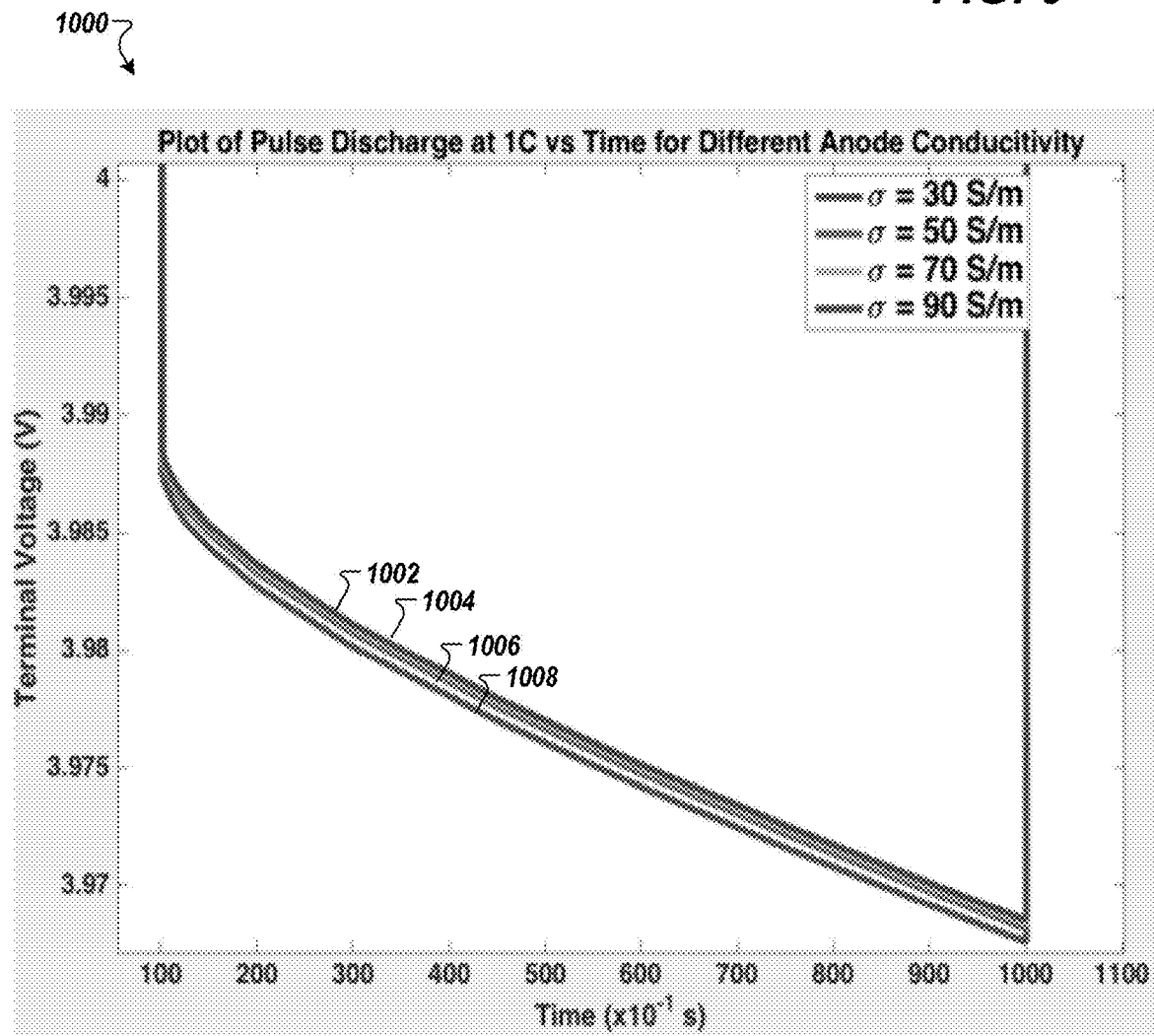
FIG. 10 is a schematic that shows the terminal voltage of the battery for a 1C pulse discharge for multiple anode conductivity values according to one example.

FIG. 10 is a schematic 1000 that shows the terminal voltage of the battery 110 for a 1C pulse discharge for multiple anode conductivity values. Trace 1002 shows the terminal voltage for an anode conductivity of 90 Siemens per meter (S/m). Trace 1004 shows the terminal voltage for an anode conductivity of 70 S/m. Trace 1006 shows the terminal voltage for an anode conductivity of 50 S/m. Trace 1008 shows the terminal voltage for an anode conductivity of 30 S/m. There is a faster drop in the terminal voltage of the battery 110 with decreasing anode conductivity of the battery.

The parameters of the TCM may be identified from the terminal voltage. In one implementation, the parameters may be identified using the method disclosed in U.S. patent publication 2016/0209472 entitled "METHOD AND APPARATUS FOR ESTIMATING BATTERY LIFE", the entire disclosure of which is incorporated herein by reference. Table 2 shows the estimated parameters of the TCM for different anode conductivity degradation levels.

TABLE 2

Estimated parameters of the TCM for anode conductivity degradation.

| Conductivity (S/m) | $R_0(\Omega)$ | $R_1(\Omega)$ | $C_1(F)$ |
|---|---|---|---|
| 90 | 0.0290 | 0.072 | 214.7766 |
| 70 | 0.0290 | 0.0072 | 214.7766 |
| 50 | 0.0302 | 0.0138 | 139.5045 |
| 30 | 0.0323 | 0.0138 | 139.4762 |

Figure 11:
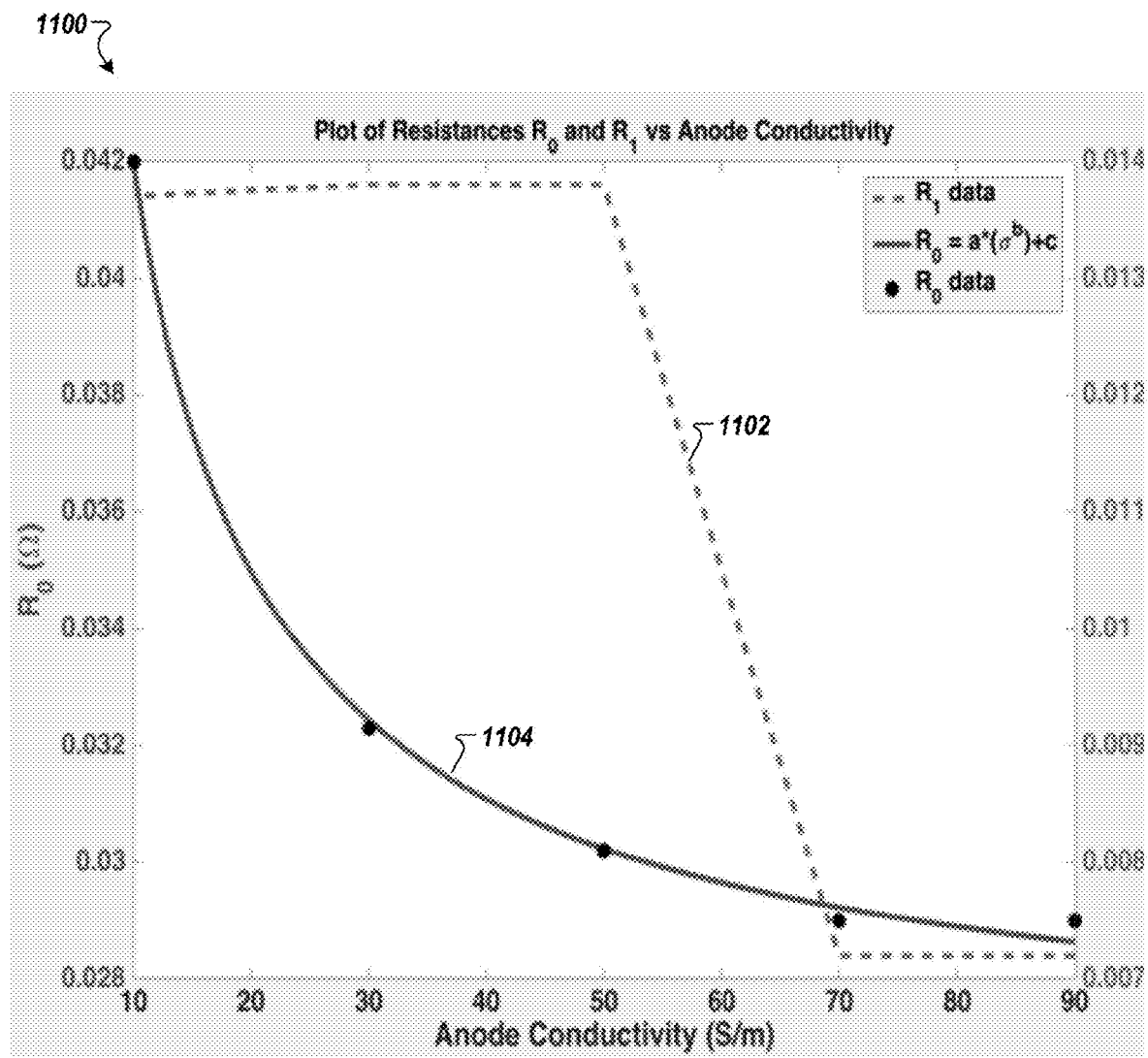
FIG. 11 is a schematic that shows parameters of the TCM according to one example.

FIG. 11 is a schematic 1100 that shows the TCM parameters for varying anode conductivity according to one example. Trace 1102 shows the relaxation resistance $R_1$. Trace 1104 shows the internal resistance $R_0$. The relaxation resistance $R_1$ and the internal resistance $R_0$ increase as the conductivity of the anode decreases.

Figure 12:
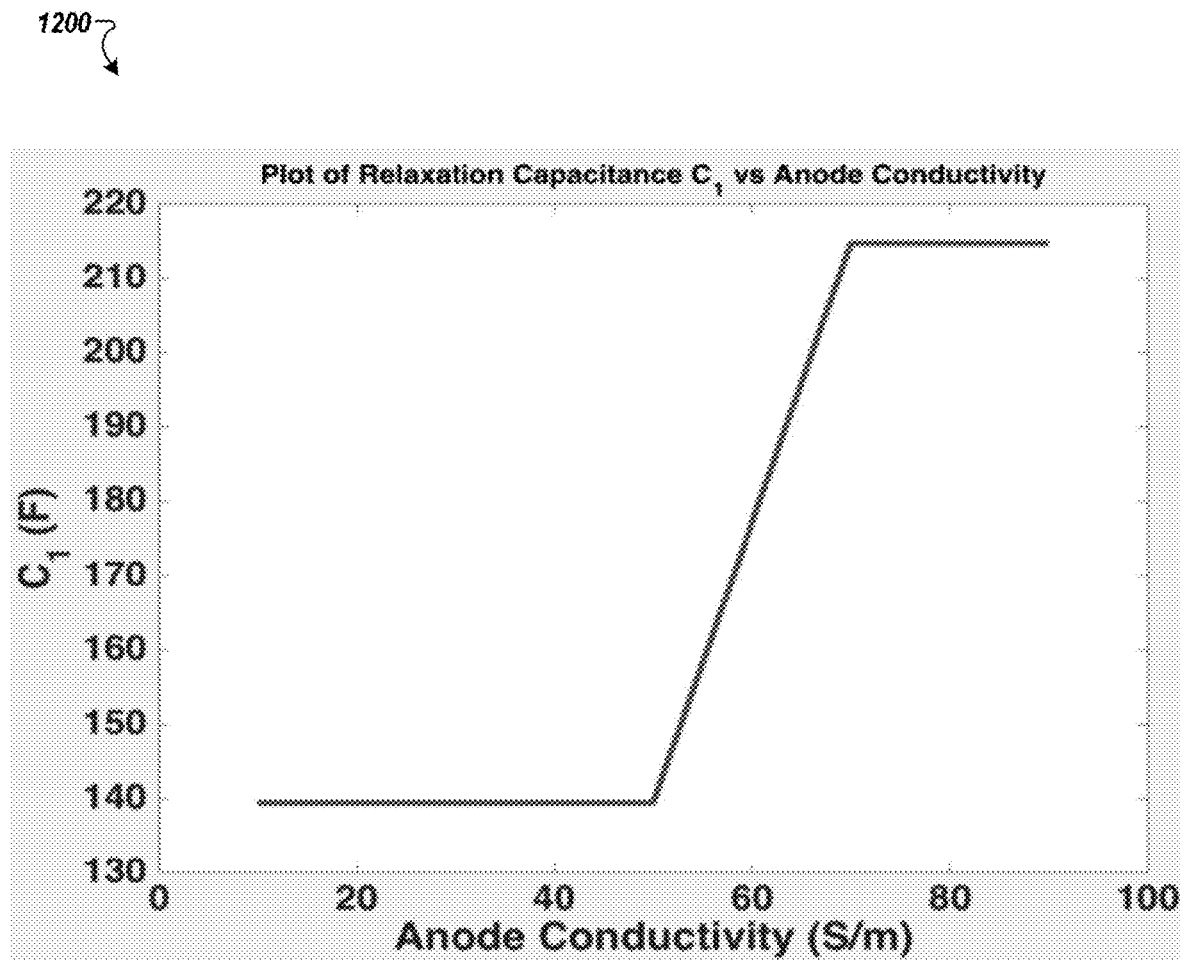
FIG. 12 is a schematic that shows the capacitance as a function of the anode conductivity according to one example.

FIG. 12 is a schematic 1200 that shows the capacitance as a function of the anode conductivity. The relaxation capacitance decreases as the conductivity of the anode decreases. This is in compliance with equations (10) and (11) described previously herein.

Figure 13:
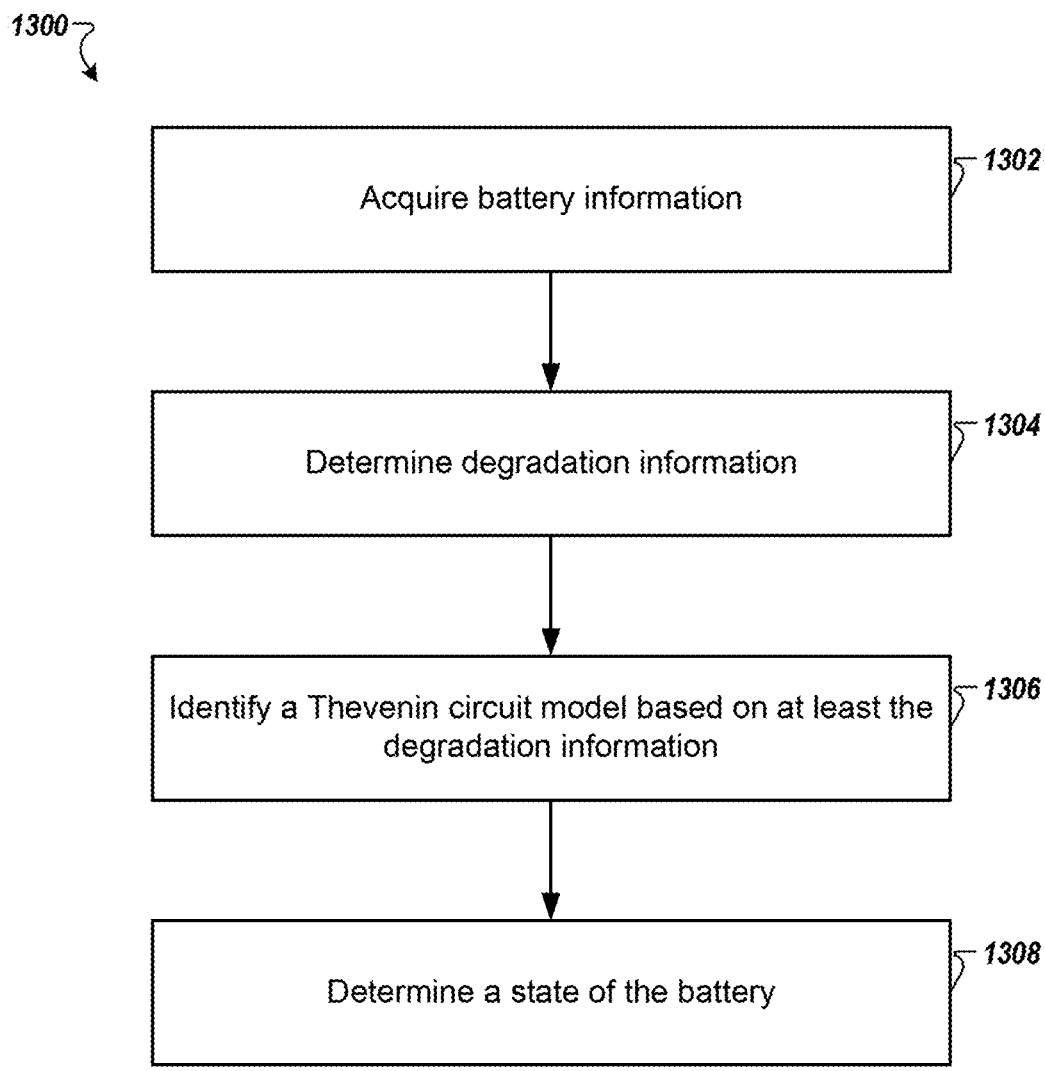
FIG. 13 is a flowchart that shows a method for identifying a battery model according to one example.

FIG. 13 is a flowchart of a method 1300 for identifying a battery model according to one example. The method 1300 may be executed by the degradation model engine 104 and the circuit model engine 106.

At step 1302, the battery modeling system 102 may acquire battery information from the sensor 108 associated with the battery 110. The battery information may include a terminal current (e.g., load current or charge current) and a terminal voltage at various time instances.

At step 1304, the degradation information of the battery 110 may be determined based on the 3DM associated with the battery 110. Design parameters associated to the battery 110 may be retrieved from the circuit model database 112. For example, a parameter (e.g., conductivity) related to an anode of the battery may be determined. The level of degradation may be determined by comparing the parameter to a predetermined threshold associated with the type of the battery 110.

At step 1306, a TCM for the battery 110 is identified based on the degradation information and the battery information. The circuit model engine 106 may select the TCM based on the level of degradation. The association between circuit models and degradation levels may be stored in the circuit model database 112. For example, the number of RC pairs in the TCM of the battery 110 may be based on the degradation information. In one example, additional resistor may be included in the TCM based on the degradation information.

At step 1308, the state of the battery 110 is determined using the TCM as would be understood by one of ordinary skill in the art. The state of the battery may include the SOH and the SOF of the battery 110. For example, the level of degradation may be used to determine the SOH of the battery. The method 1300 may be executed in real-time when the battery 110 is used in critical applications such as EVs or data centers. In one implementation, the method 1300 may be executed when a request to estimate the state of the battery 110 is made. In other implementations, the battery modeling system 102 may output an utilization pattern to the users that can meet the demand and prolong the remaining useful life of the battery 110 based on the degradation information and the state of the battery 110 determined by the degradation model engine 104 and the circuit model engine 106.

In one implementation, one or more control actions may be implemented based on the state of the battery. For example, in response to determining that the state of health of the battery is below a predetermined level, the battery operation may be modified to prolong life. In other implementations, notifications may be output when the SOH of the battery 110 is below the predetermined threshold. The real-time and accurate SOH may increase usability and replacement time of the battery 110.

In one implementation, the functions and processes of the first principle model engine 104 and the Thevenin circuit model engine 106 may be implemented by a computer 1426. Next, a hardware description, of the computer 1426 according to exemplary embodiments is described with reference to FIG. 14. In FIG. 14, the computer 1426 includes a CPU 1400 which performs the processes described herein. The process data and instructions may be stored in memory 1402. These processes and instructions may also be stored on a storage medium disk 1404 such as a hard drive (HDD) or portable storage medium or may be stored remotely. Further, the claimed advancements are not limited by the form of the computer-readable media on which the instructions of the inventive process are stored. For example, the instructions may be stored on CDs DVDs, in FLASH memory, RAM, ROM, PROM, EPROM, EEPROM, hard disk or any other information processing device with which the computer 1426 communicates, such as a server or computer.

Further, the claimed advancements may be provided as a utility application, background daemon, or component of an operating system, or combination thereof, executing in conjunction with CPU 1400 and an operating system such as Microsoft® Windows®, UNIX®, Oracle® Solaris, LINUX®, Apple macOS® and other systems known to those skilled in the art.

In order to achieve the computer 1426, the hardware elements may be realized by various circuitry elements, known to those skilled in the art. For example, CPU 1400 may be a Xenon® or Core® processor from Intel Corporation of America or an Opteron® processor from AMD of America, or may be other processor types that would be recognized by one of ordinary skill in the art. Alternatively, the CPU 1400 may be implemented on an FPGA, ASIC, PLD or using discrete logic circuits, as one of ordinary skill in the art would recognize. Further, CPU 1400 may be implemented as multiple processors cooperatively working in parallel to perform the instructions of the inventive processes described above.

The computer 1426 in FIG. 14 also includes a network controller 1406, such as an Intel Ethernet PRO network interface card from Intel Corporation of America, for interfacing with network 1424. As can be appreciated, the network 1424 can be a public network, such as the Internet, or a private network such as LAN or WAN network, or any combination thereof and can also include PSTN or ISDN sub-networks. The network 1424 can also be wired, such as an Ethernet network, or can be wireless such as a cellular network including EDGE, 3G and 4G wireless cellular systems. The wireless network can also be WiFi®, Bluetooth®, or any other wireless form of communication that is known.

The computer 1426 further includes a display controller 1408, such as a NVIDIA® GeForce® GTX or Quadro® graphics adaptor from NVIDIA Corporation of America for interfacing with display 1410, such as a Hewlett Packard® HPL2445w LCD monitor. A general purpose I/O interface 1412 interfaces with a keyboard and/or mouse 1414 as well as an optional touch screen panel 1416 on or separate from display 1410. General purpose I/O interface also connects to a variety of peripherals 1418 including printers and scanners, such as an OfficeJet® or DeskJet® from Hewlett Packard®.

The general purpose storage controller 1420 connects the storage medium disk 1404 with communication bus 1422, which may be an ISA, EISA, VESA, PCI, or similar, for interconnecting all of the components of the computer 1426. A description of the general features and functionality of the display 1410, keyboard and/or mouse 1414, as well as the display controller 1408, storage controller 1420, network controller 1406, and general purpose I/O interface 1412 is omitted herein for brevity as these features are known.

The features of the present disclosure provide a multitude of improvements in the technical field of battery management. Using the 3DM model the degradation of anode conductivity may be related to the performance of the battery. As the conductivity of the anode decreased, the IR drop/rise increased. As the conductivity of the anode decreases, the capacitance in the TCM decreases significantly. The internal resistance and the conductivity of the anode is almost an inverse relationship. Therefore, the decrease in the conductivity of the anode has a direct impact on the internal resistance of the TCM of the battery. Unlike the impact on the internal resistance, the conductivity of the anode does not have a strong impact on the relaxation resistance and capacitance of the 1-RC model of the battery. Thus, the TCM may be modified based on the level of degradation.

Obviously, numerous modifications and variations are possible in light of the above teachings. It is therefore to be understood that within the scope of the appended claims, the invention may be practiced otherwise than as specifically described herein.

Thus, the foregoing discussion discloses and describes merely exemplary embodiments of the present invention. As will be understood by those skilled in the art, the present invention may be embodied in other specific forms without departing from the spirit or essential characteristics thereof. Accordingly, the disclosure of the present invention is intended to be illustrative, but not limiting of the scope of the invention, as well as other claims. The disclosure, including any readily discernible variants of the teachings herein, defines, in part, the scope of the foregoing claim terminology such that no inventive subject matter is dedicated to the public.

The invention claimed is:

1. A method for determining a state of a battery, the method comprising:
   acquiring battery information from at least one sensor associated with the battery, the battery information including at least a terminal voltage and a terminal current;
   estimating, using processing circuitry, degradation information based on a first principle degradation model and the battery information, the first principle degradation model being a three dimensional model and including a plurality of layers having one or more attributes representative of physical parameters of the battery;
   identifying, using the processing circuitry, a circuit model representative of the battery based on the degradation information and the battery information;
   determining, using the processing circuitry, the state of the battery using the identified circuit model; and
   implementing a control action or a notification based on the determined state of the battery.

2. The method of claim 1, wherein identifying the circuit model includes selecting a Thevenin circuit model topology from a plurality of topologies.

3. The method of claim 2, wherein selecting the Thevenin circuit model topology includes matching a degradation level with one of the plurality of topologies using a look-up table.

4. The method of claim 1, wherein identifying the circuit model includes identifying at least one parameter of a Thevenin circuit model.

5. The method of claim 1, further comprising:
   determining a parameter related to an anode of the battery; and
   comparing the determined parameter to a predetermined threshold in order to evaluate another parameter representative of the state of the battery.

6. The method of claim 1, wherein the plurality of layers of the first principle degradation model includes one or more anode layers, a cathode layer, and an electrolyte layer positioned between the cathode layer and the one or more anode layers.

7. The method of claim 6, wherein the one or more anode layers include porous electrodes surrounded by electrolyte.

8. The method of claim 1, wherein the battery is a lithium-ion battery.

9. The method of claim 1, wherein the state of the battery represents a state of function, a state of health, or a state of charge.

10. The method of claim 1, wherein the first principle degradation model is a time dependent model.

11. The method of claim 1, wherein the physical parameters include a battery capacity, an electrode width, and an electrolyte width.

12. A battery system, comprising
   a battery;
   at least one sensor configured to detect at least a terminal voltage and a terminal current; and
   circuitry configured to
      acquire battery information from the at least one sensor,
      estimate degradation information based on a first principle degradation model and the battery information, the first principle degradation model being a three dimensional model and including a plurality of layers having one or more attributes representative of physical parameters of the battery,
      identify a circuit model representative of the battery based on the degradation information and the battery information,
      determine a state of the battery using the identified circuit model, and
      implement a control action or a notification based on the determined state of the battery.

13. The system of claim 12, wherein identifying the circuit model includes selecting a Thevenin circuit model topology from a plurality of topologies.

14. The system of claim 13, wherein selecting the Thevenin circuit model topology includes matching a degradation level with one of the plurality of topologies using a look-up table.

15. The system of claim 12, wherein identifying the circuit model includes identifying at least one parameter of a Thevenin circuit model.

16. The system of claim 12, wherein the circuitry is further configured to:
   determine a parameter related to an anode of the battery; and
   compare the determined parameter to a predetermined threshold in order to evaluate another parameter representative of the state of the battery.

17. The system of claim 12, wherein the plurality of layers of the first principle degradation model includes one or more anode layers, a cathode layer, and an electrolyte layer positioned between the cathode layer and the one or more anode layers.

18. The system of claim 17, wherein the one or more anode layers include porous electrodes surrounded by electrolyte.

19. The system of claim 12, wherein the state of the battery represents a state of function, a state of health, or a state of charge.

20. An apparatus for determining a state of a battery, the apparatus comprising:
   at least one sensor configured to acquire battery information from a battery, the battery information including at least a terminal voltage and a terminal current; and
   processing circuitry configured to
      estimate degradation information based on a first principle degradation model and the battery information, the first principle degradation model being a three dimensional model and including a plurality of layers having one or more attributes representative of physical parameters of the battery,
      identify a circuit model representative of the battery based on the degradation information and the battery information,
      determine a state of the battery using the identified circuit model, and
   implement a control action or a notification based on the determined state of the battery.

* * * * *